United States Patent [19]
Mukougawa et al.

[11] Patent Number: 5,153,818
[45] Date of Patent: Oct. 6, 1992

[54] IC MEMORY CARD WITH AN ANISOTROPIC CONDUCTIVE RUBBER INTERCONNECTOR

[75] Inventors: Junichi Mukougawa, Yokohama; Toshio Fukuma, Ebina, both of Japan

[73] Assignee: Rohm Co., Ltd., Kyoto, Japan

[21] Appl. No.: 623,195

[22] Filed: Dec. 6, 1990

[30] Foreign Application Priority Data

Apr. 20, 1990 [JP] Japan .................. 2-104563
Oct. 23, 1990 [JP] Japan .................. 2-285535

[51] Int. Cl.⁵ .......................... H05K 7/10; H01R 4/58
[52] U.S. Cl. ...................... 361/395; 361/392; 439/86
[58] Field of Search ............ 235/492, 495; 361/392, 361/394, 395, 399; 439/86, 89, 91, 136, 271, 278, 587

[56] References Cited

U.S. PATENT DOCUMENTS

| | | |
|---|---|---|
| 3,519,975 | 7/1970 | Prow, Jr. et al. .............. 439/271 |
| 3,571,779 | 3/1971 | Collier ........................ 439/271 X |
| 3,668,476 | 6/1972 | Wrabel et al. ................. 361/395 X |
| 4,531,176 | 7/1985 | Beecher, II ................... 361/395 X |
| 4,705,336 | 11/1987 | Bonhomme .................... 439/587 X |
| 4,776,813 | 10/1988 | Wilson et al. ................. 439/587 |
| 4,889,498 | 12/1989 | Mizuta ........................ 439/86 |
| 4,905,124 | 2/1990 | Banjo et al. .................. 361/395 |
| 4,918,814 | 4/1990 | Redmond et al. ............... 439/91 X |
| 4,927,368 | 5/1990 | Shino ......................... 439/91 X |

FOREIGN PATENT DOCUMENTS 2041828 9/1980 United Kingdom ............. 439/86
2069251 8/1981 United Kingdom ............. 439/86

*Primary Examiner*—Leo P. Picard
*Assistant Examiner*—Michael W. Phillips
*Attorney, Agent, or Firm*—Oliff & Berridge

[57] ABSTRACT

An IC memory card having a connector structure adapted to be connected with the terminal pins of an external read/writer. A card case has in its end surface a row of openings for receiving the terminal pins. An interconnector receiving chamber is disposed rearwardly of the row of openings and communicates therewith. In the interconnector receiving chamber, an elastic interconnector of anisotropic conductive rubber, which is conductive in the direction of thickness, is mounted. When the terminal pins are inserted, they are electrically conducted with a printed circuit board via the interconnector so that the connector structure inside the memory card can be automatically accomplished. The interconnector is in the form of a thin strip; the memory card can be assembled very simple by merely mounting this interconnector in the interconnector receiving chamber. A retainer plate of insulating rubber is placed over the interconnector to airtightly seal the latter from the external.

8 Claims, 11 Drawing Sheets

IC MEMORY CARD WITH AN ANISOTROPIC CONDUCTIVE RUBBER INTERCONNECTOR

BACKGROUND OF THE INVENTION

1. Field of the Invention

This invention relates generally to an IC memory card, and more particularly to an improvement of terminal joints of an IC memory card for use as an external storage medium of an electronic data processing machine.

2. Description of the Related Art

As is known in the art, when an IC memory card, in the form of a plastic card in which an IC memory is mounted, is inserted in an electronic data processing machine to be connected with a read/writer, the read/writer can read/write necessary data stored in the IC memory. For this reason, an IC memory card is usable for various kinds of electronic systems in which a large quantity of data, must be stored in a handy card.

Such IC memory card is usable in database, such as a bankbook, dictionary data or map data, and is particularly useful in settlement of bank accounts or for expansion memory of an electronic pocketbook. It is also usable as a program source of a computer, and is particularly useful as a simple external storage medium for a personal computer or a relatively large computer. However, in this kind of IC memory card, an electrical contact between the memory card and the read/writer is needed to read/write data; for this purpose, a durable inexpensive connector structure is required to realize a simple reliable connection.

Conventional connector structures are classified into two types: a card-edge type and a two-piece type.

In the card-edge type connector structure, a plurality of lead terminals are exposed to an end surface of the IC memory card. When the card is inserted into the read/writer, the exposed lead terminals are connected with the terminal strip on the read/writer side. Because its structure is simple and can be realized at a low cost, this connecting system has commonly been used, for example, in a game machine. But this conventional structure is poor in reliability and durability and cannot be used in a high-quality IC memory card.

In the two-piece type connector structure, a plurality of male terminal pins mounted on the read/writer can be coupled with a female terminal mounted on the IC memory card. Since the individual male and female terminals are interconnected with each other stably, a durable and reliable memory card can be obtained.

However, the conventional two-piece type connector structure requires a female connector on the IC memory card for every terminal. It is difficult to incorporate connectors, each in the form of such a metal spring, in a thin memory card.

Particularly for modern memory cards, a large number of terminal pins, such as 34 pins in a row and 68 pins in two rows, are required according to, for example, the JEIDA (Japan Electronic Industry Development Association) standard. Also from a view point of cost, it is short of reality to incorporate this complex connector structure in a memory card.

SUMMARY OF THE INVENTION

It is therefore an object of this invention to provide an IC memory card which is simple and can be assembled easily, thus guaranteeing a reliable connection.

Another object of the invention is to provide an improved IC memory card in which external dust or the like is prevented from entering the terminal portion of the card, causing good performance for adequately long period, even in poor environment.

According to a first aspect of the invention, there is provided an IC memory card comprising: an electrically insulating card case having a row of openings for receiving terminal pins of read/writer and an interconnector receiving chamber communicating with the openings; a printed wiring board fixed to the card case and carrying an IC memory, the printed wiring board being provided with lead terminals which are disposed in the interconnector receiving chamber at positions corresponding to the openings and are electrically connected with the IC memory; and an interconnector being conductive in a direction of thickness and being made of an anisotropic conductive rubber, the interconnector being mounted in the interconnector receiving chamber and being, at one end of the direction of thickness, adapted to be electrically conducted with the IC memory via the lead terminals and being at the other end adapted to engage the terminal pins when the terminal pins are inserted into the openings, whereby the terminal pins are electrically conducted with the IC memory.

According to a second aspect of the invention, there is provided an IC memory card comprising: an electrically insulating card case having a row of openings for receiving terminal pins of read/writer and an interconnector receiving chamber communicating with the openings; a printed wiring board fixed to the card case and carrying an IC memory, the printed wiring board being provided with lead terminals which are disposed in the interconnector receiving chamber at positions corresponding to the openings and are electrically connected with the IC memory; an interconnector being conductive in a direction of thickness and being made of an anisotropic conductive rubber, the interconnector being mounted in the interconnector receiving chamber and being, at one end of the direction of thickness, adapted to be electrically conducted with the IC memory via the lead terminals and being at the other end adapted to engage the terminal pins when the terminal pins are inserted into the openings; and a retainer plate of elastic insulating rubber disposed in the interconnector receiving chamber in a laminated relationship with the interconnector; whereby the terminal pins are electrically conducted with the IC memory.

With the first arrangement of the invention, when assembling the IC memory card, the connector portion of the card can be constructed preferably by simply mounting the strip of interconnector in the interconnector receiving chamber of the card case and by merely fixing the printed wiring board to the card case. Therefore, unlike the conventional art, it is unnecessary to assemble a female connector for every terminal, and it is also unnecessary to solder the connector and the printed wiring board together.

When the terminal pins of the read/writer are inserted into the openings of the memory card, the interconnector is electrically conducted, only at portions corresponding to the terminal pins in the direction of thickness of the interconnector, with the terminal pins so that the connector terminals are automatically aligned with each other.

Since the interconnector is mounted within the card, a miscontact, unlike the conventional card-edge type connector, cannot occur, thus causing good durability.

With the second arrangement of the invention, if the retainer plate of insulating rubber is kept in contact with the interconnector, a space into which the terminal pins are to be introduced is defined between the interconnector and the retainer plate only when the terminal pins are inserted. When the terminal pins are not inserted, the interconnector is shielded from external dust or the like by the retainer plate of insulating rubber. Therefore, dust or the like is reliably prevented from penetrating from the external environment, so that a much more durable connector structure can be achieved, compared to the conventional two-piece type.

Further, since the connector of the memory card is realized by the interconnector solely or by the interconnector and the retainer plate in combination, it is possible to obtain a very small and thin type connector structure so that such lead terminals in two rows can be provided within the memory card, causing an improved degree of packing density of the card. Thus this invention is particularly useful when embodied in a multi-pin memory card.

As mentioned above, in the case where both the interconnector and the retainer plate of insulating rubber are used, the terminal pins of the read/writer are forced into the space between the interconnector and the retainer plate when inserted into the openings of the card case. Thus, the terminal pins can be electrically connected with the printed wiring board via the interconnector with maximum reliability.

Alternatively, if the retainer plate is not in the form of a planer plate and has, for example, at least one longitudinally extending ridge, it is possible to minimize the resistance when the interconnector and the retainer plate are forcibly spread apart from each other by the terminal pins.

After the terminal pins have drawn from the memory card, this ridge restores in intimate contact with the surface of the interconnector so that dust or the like can be reliably prevented from penetrating from the outside environment.

DETAILED DESCRIPTION

Preferred embodiments of this invention will now be described with reference to the accompanying drawings.

Figure 1:
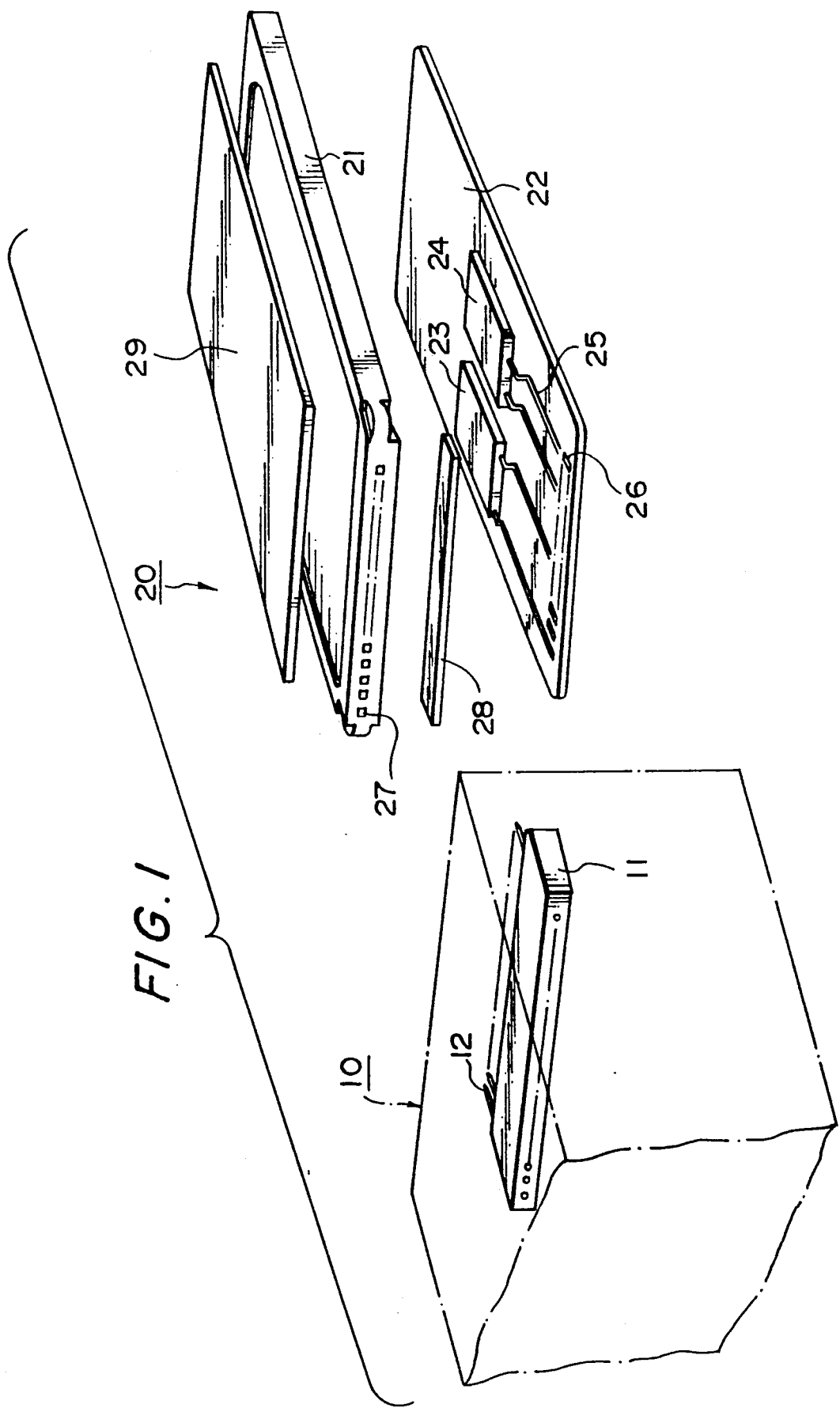
FIG. 1 is an exploded perspective view of an IC memory card according to a first embodiment of this invention, showing the relationship between the IC memory card and an external read/writer.

FIG. 1 shows a first embodiment of the invention.

In FIG. 1, a read/writer 10 has therein an I/O connector plate 11 in which a plurality of terminal pins 12 are mounted. The individual terminal pin 12 is in the form of a metal rod of a circular cross section having a sharp distal end and is gold-plated. These terminal pins 12 are arranged according to, for example, the JEIDA (Japan Electronic Industry Development Association) standard.

On the other hand, an IC memory card 20 includes a card case 21 of an electrically insulating material such as plastic, on which case a printed wiring board 22 is mounted. As is well known in the art, on the surface of the printed wiring board 22, IC memories 23, 24 are mounted whose terminals are connected, by soldering or bonding, to lead wires 25 formed on the printed wiring board 22.

On the printed wiring board 22, each lead wire 25 extends near the end surface of the printed wiring board 22 and is connected to a row of lead terminals 26.

These lead terminals 26 extend to an interconnector receiving chamber (described below) of the card case 21 and are electrically connected to terminal pins 12 of the read/writer 10 via an interconnector (described below).

The card case 21 has in its end surface a row of openings 27 into which the terminal pins 12 are to be inserted.

In an interconnector receiving chamber disposed rearwardly of the openings 27 and communicating therewith, an interconnector 28 of anisotropic conductive rubber is mounted, so that the terminal pins 12 can be electrically connected with the interconnector 28 and hence, the lead terminals 26 in a reliable self-alignment action.

To prevent external electrostatic noise from penetrating into the IC memories 23, 24, a copper foil is applied to a rear surface of the printed wiring board 22. Further, an aluminum shield plate 29 is fixed to the upper surface of the card case 21 to electrically shield the IC memories 23, 24.

Figure 3:
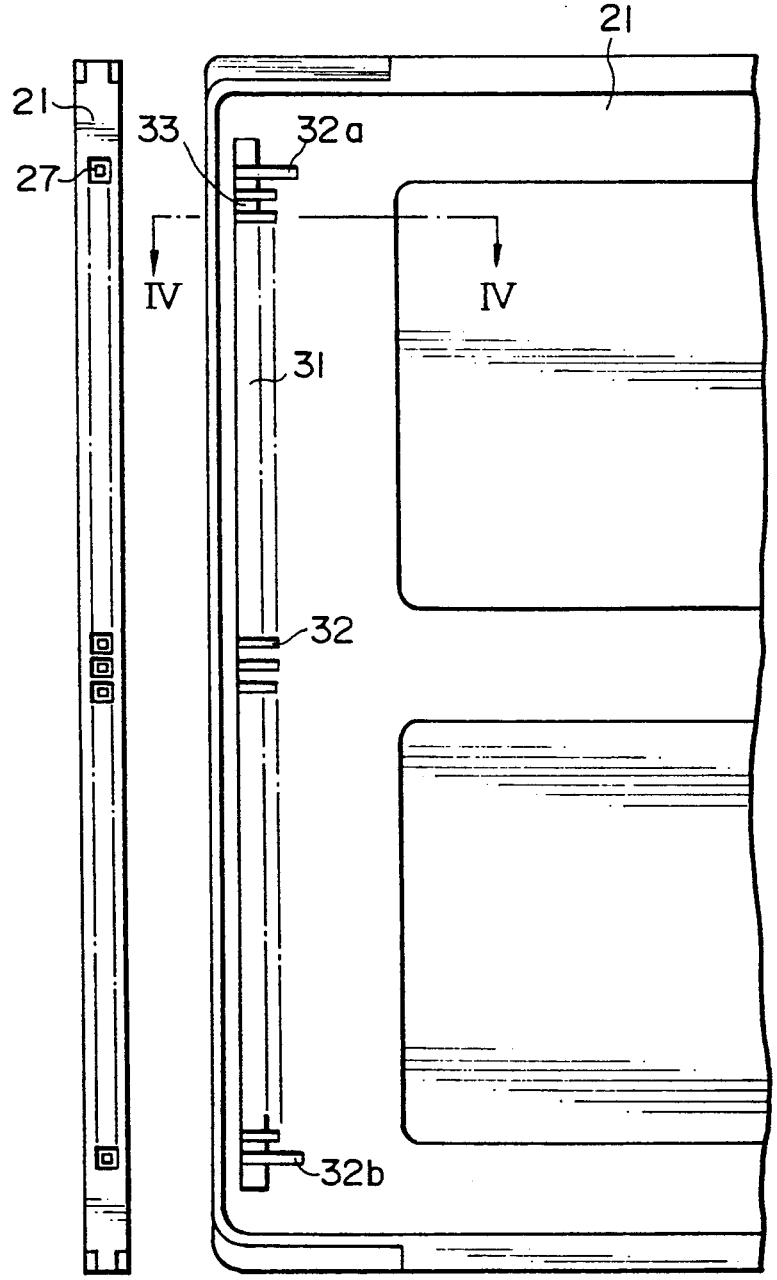
FIG. 3 is a side view of FIG. 2.
Figure 2:
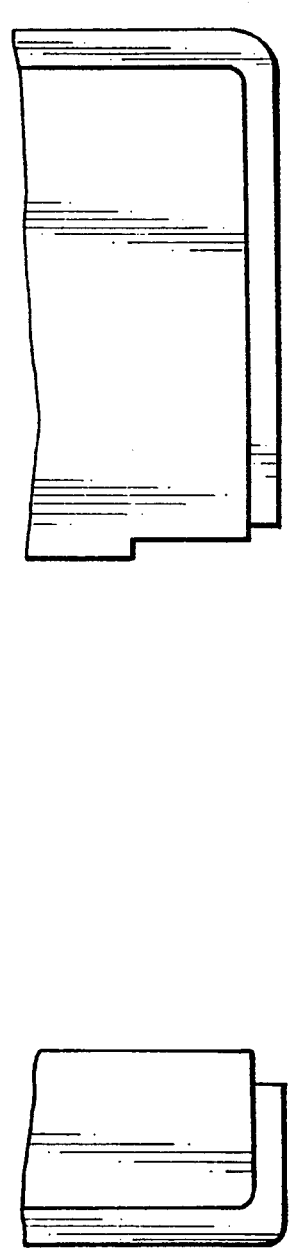
FIG. 2 is a fragmentary bottom view of a card case of the first embodiment.
Figure 4:
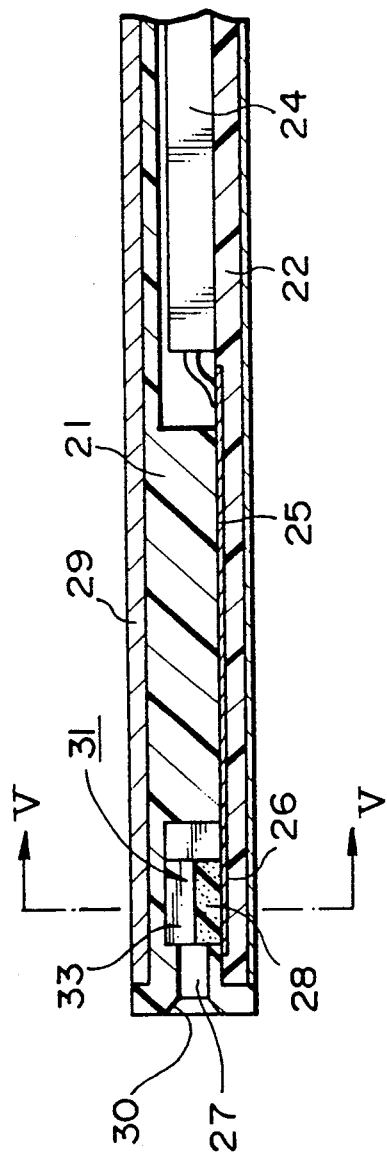
FIG. 4 is a fragmentary cross-sectional view taken along line IV—IV of FIG. 2, showing the manner in which an interconnector and a printed wiring board are mounted.
Figure 5:
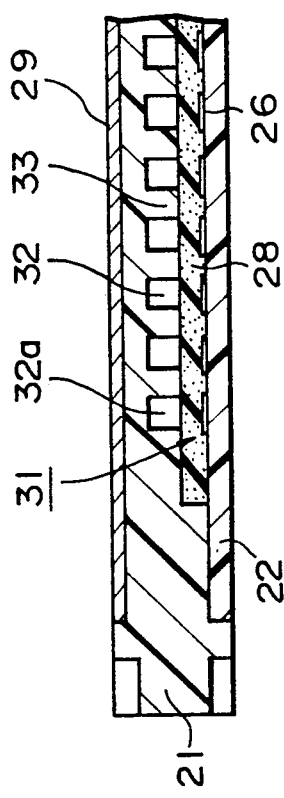
FIG. 5 is a fragmentary cross-sectional view taken along line V—V of FIG. 4.

FIG. 2 is a bottom view of the card case 21 of FIG. 1, and FIG. 3 is a side view of FIG. 2. FIG. 4 is a cross-sectional view taken along line IV—IV of FIG. 2, showing the manner in which the interconnector 28 and the printed wiring board 22 are mounted in the card case 21. FIG. 5 is a cross-sectional view taken along line V—V of FIG. 4.

Each opening 27 is square in cross section and has at its inlet end a taper surface 30 so that the individual terminal pin 12 can be inserted into the corresponding opening 27 with ease. These openings 27 are arranged in a row according to the JEIDA standard. Alternatively, the openings 27 may be arranged in two rows at need to receive many terminal pins.

An interconnector receiving chamber 31 is disposed rearwardly of the row of openings 27 and communicating therewith. In the interconnector receiving chamber 31, the interconnector 28 is mounted. As is seen from FIG. 2, the interconnector receiving chamber 31 is in the shape of an elongated strip, and likewise the interconnector 28 also is in the shape of an elongated strip. In this invention, the interconnector 28 may be divided into a plurality of parts. Preferably, the interconnector 28 should be in the form of a single strip to facilitate assembly.

In the card case 21, pin insertion chambers 32 for receiving the terminal pins 12 are formed so as to be arranged over the interconnector receiving chamber 31, communicating therewith.

In FIG. 2, the pin insertion chambers 32 are disposed in alignment with the openings 27. A pair of opposite end elongated pin insertion chambers 32a, 32b is used for the purposes of power source and grounding, respectively, while the remaining pin insertion chambers 32 are used in reading/writing data.

As shown in FIGS. 2, 4 and 5, combteeth-like connector holders 33 are formed between each of adjacent pairs of the pin insertion chambers 32, thereby partitioning the pin insertion chambers 32, one for each opening 27. When it is inserted into the interconnector receiving chamber 31, the interconnector 28 is held in the interconnector receiving chamber 31 by the connector holders 33 so as not to float toward the terminal pins 12.

Figure 6:
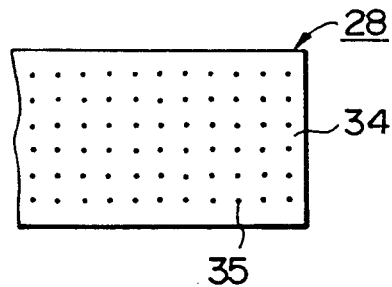
FIG. 6 is a fragmentary plan view showing one example of the interconnector.
Figure 7:
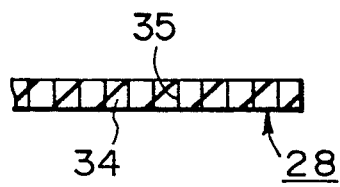
FIG. 7 is a fragmentary cross-sectional view of of FIG. 6.

The interconnector 28 is made of an elastic anisotropic conductive rubber and is conductive in the direction of thickness. For example, the interconnector 28 should preferably be in the form of an anisotropic conductive sheet including an insulating silicon rubber sheet in which metal wires are arranged in matrix with their axes directed in the direction of thickness. Preferably, the anisotropic conductive sheet is a Shinetsu interconnector type GD produced by Shinetsu Polymer Co., Ltd. FIGS. 6 and 7 show this interconnector, in which wires 35 of copper beryllium are arranged in the direction of thickness of a silicon rubber 34 at a pitch of 0.2 mm. The end surface of the individual wire 35 is preferably plated with gold. Alternatively, the individual wire 35 may be copper or brass and may have a diameter of 30 to 60 $\mu$m.

Figure 8:
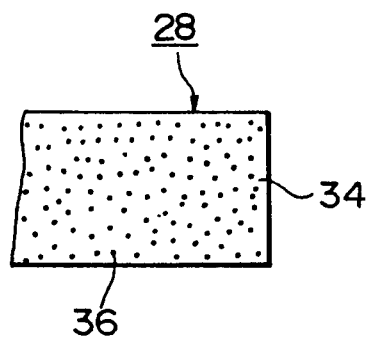
FIG. 8 is a fragmentary plan view of another example of interconnector.
Figure 9:
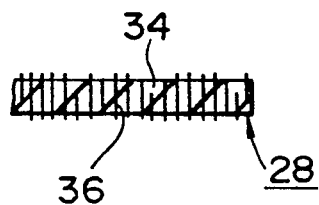
FIG. 9 is a fragmentary cross-sectional view of FIG. 8.

FIGS. 8 and 9 show another example of interconnector, which is now commercially available, as a Shinetsu interconnector type MAF, from Shinetsu Polymer Co., Ltd.

This interconnector 28 is in the form of an anisotropic conductive sheet in which metal fibers 36 are arranged at high density in the direction of thickness of the insulating silicon rubber 34. This type of interconnector can be purchased at a lower cost than the metal wire arrangement shown in FIGS. 6 and 7.

Figure 10:
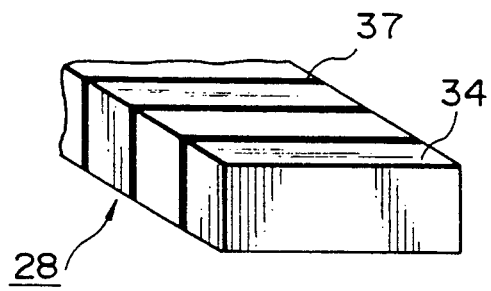
FIG. 10 is a fragmentary perspective view of still another example of interconnector.

Further, FIG. 10 shows still another example of the interconnector 28, in which a plurality of pieces of gold-plated carbon fiber fabric or felt 37 are arranged at intervals in the insulating silicon rubber 34. According to this type of anisotropic conductive rubber, the resulting IC memory card is adequately durable and be manufactured at a remarkably low price.

Therefore, using an interconnector of anisotropic conductive rubber, it is possible to connect the terminal pins 12 with the lead terminals 26 of the printed wiring board 22 reliably.

Figure 11:
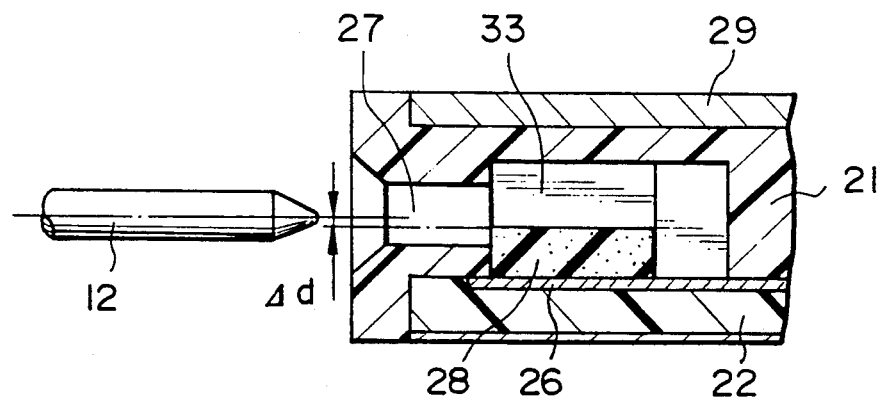
FIGS. 11 and 12 show the manner in which the individual terminal pin is inserted according to the first embodiment.
Figure 12:
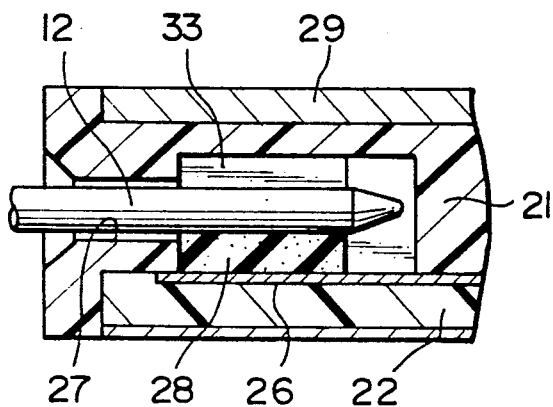

FIGS. 11 and 12 show the manner in which the individual terminal pins 12 is inserted.

In FIG. 11, a gap $\Delta d$ is defined between the central axis of the individual pin 12 and the surface of the interconnector 28. Because of this offset, a good contact can be achieved when the terminal pins 12 are inserted, and very good durability also can be achieved.

If the interconnector 28 is thick, the individual terminal pins 12 might pierce into the interconnector 28 or might be broken when the terminal pins 12 are inserted. Further, if the gap $\Delta d$ is large, adequate compression and conductivity cannot be obtained.

Therefore, in this embodiment, it is significant to set the ga $\Delta d$ to the optimum.

In this embodiment, if the terminal pin 12 has a diameter of about 400 $\mu$m, it is preferable that the gap $\Delta d$ is approximately 100 $\mu$m.

According to the experiments conducted under the direction of the present inventor(s), in the example of FIG. 11, the initial contact resistance value of 100 $\mu\Omega$ can be maintained with almost no change for more than 50,000 contacts.

FIG. 12 shows the state in which the individual terminal pin 12 is inserted into the interconnector 28 from the openings 27, with contacting the interconnector 28. In this state, the interconnector 28 is compressed at portions where it is engaged with the terminal pins 12 so that a plurality of elongated wires can contact the terminal pins 12 and the lead terminals 26 commonly with reliableness, thus guaranteeing adequate electrical conduction.

As is apparent from FIG. 12, if the sizes of various parts are in such a manner that the distal ends of the terminal pins 12 will project from the interconnector 28 when they are inserted, inserting resistance would be reduced when the terminal pins 12 are inserted all the way, giving a touch of good insertion.

Specifically, when the terminal pins 12 are completely inserted, the resistance would be reduced to secure a stable connection between the terminal pins 12 and the memory card, so that the operator can feel on his/her hand the completion of insertion.

Figure 13:
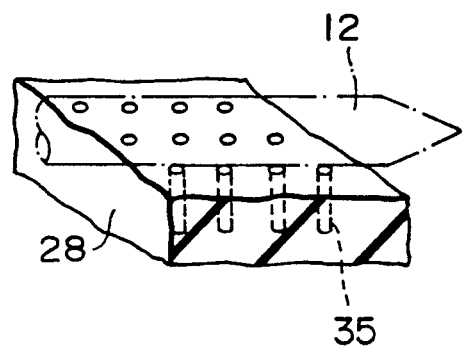
FIG. 13 shows the state in which the individual terminals are in contact with the interconnector according to the first embodiment.

FIG. 13 shows the state in which the interconnector 28 is compressed and deformed by the terminal pins 12 and in which eight wires 35 in two rows are slightly inclined and are at their distal ends in contact with the terminal pins 12.

As discussed above, since automatic self-alignment of the terminal pins 12 can be achieved as they are electrically engaged with the lead terminals 26 via optional metal wirings, metal fibers 36 or carbon fiber felt 37 when inserted, it is unnecessary to think about the positional alignment of the interconnector 28 with the individual openings 27.

Figure 14:
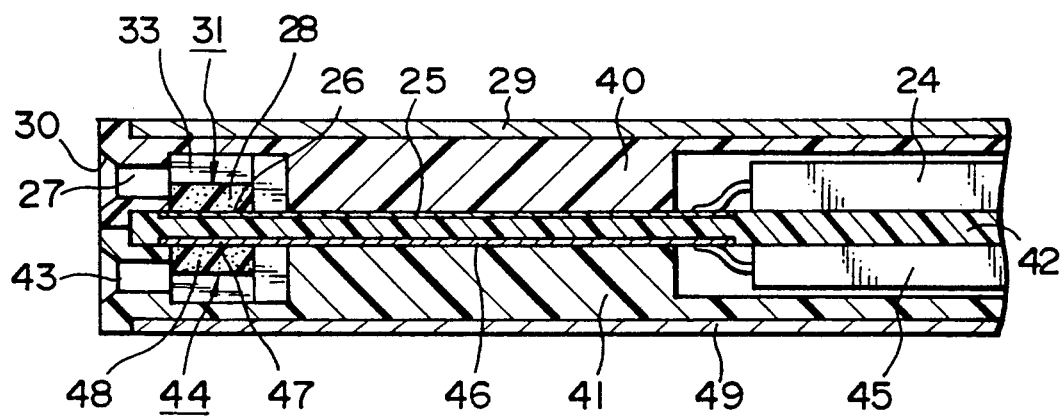
FIG. 14 is a fragmentary cross-sectional view showing a second embodiment in which the card has a double structure.

FIG. 14 shows a second embodiment; like reference numerals designate parts similar to those of FIG. 4.

The second embodiment is a double-terminal-type IC memory card, in which a printed wiring board 42 is fixedly sandwiched between an upper card case 40 and a lower card case 41. Like the previous embodiment, an IC memory 24 is fixed to the upper surface of the printed wiring board 42, and the structure to receive the terminal pins of the read/writer is also similar to that of FIG. 4.

For a significant feature of this embodiment, the upper and lower card cases 42, 41 are arranged symmetrically. The lower card case 41 also has openings 43, and an interconnector receiving chamber 44 contiguous to the openings 43 also are identical in structure with the interconnector receiving chamber 31 described above.

On the bottom surface of the printed wiring board 42, an IC memory is mounted, and as a result, it is possible to increase the data capacity of IC memory card. Lead wires 46 is electrically connected to the IC memory 45 and has a lead terminal 47 extending to a position to contact an interconnector 48 so that the lead wires 46 to be inserted from the openings 43 can be electrically connected with the IC memory 45 from the lead wire via the interconnector 48. In this embodiment, on the surface of the lower card case 41, an aluminum shield plate 49 is fixed.

Figure 15:
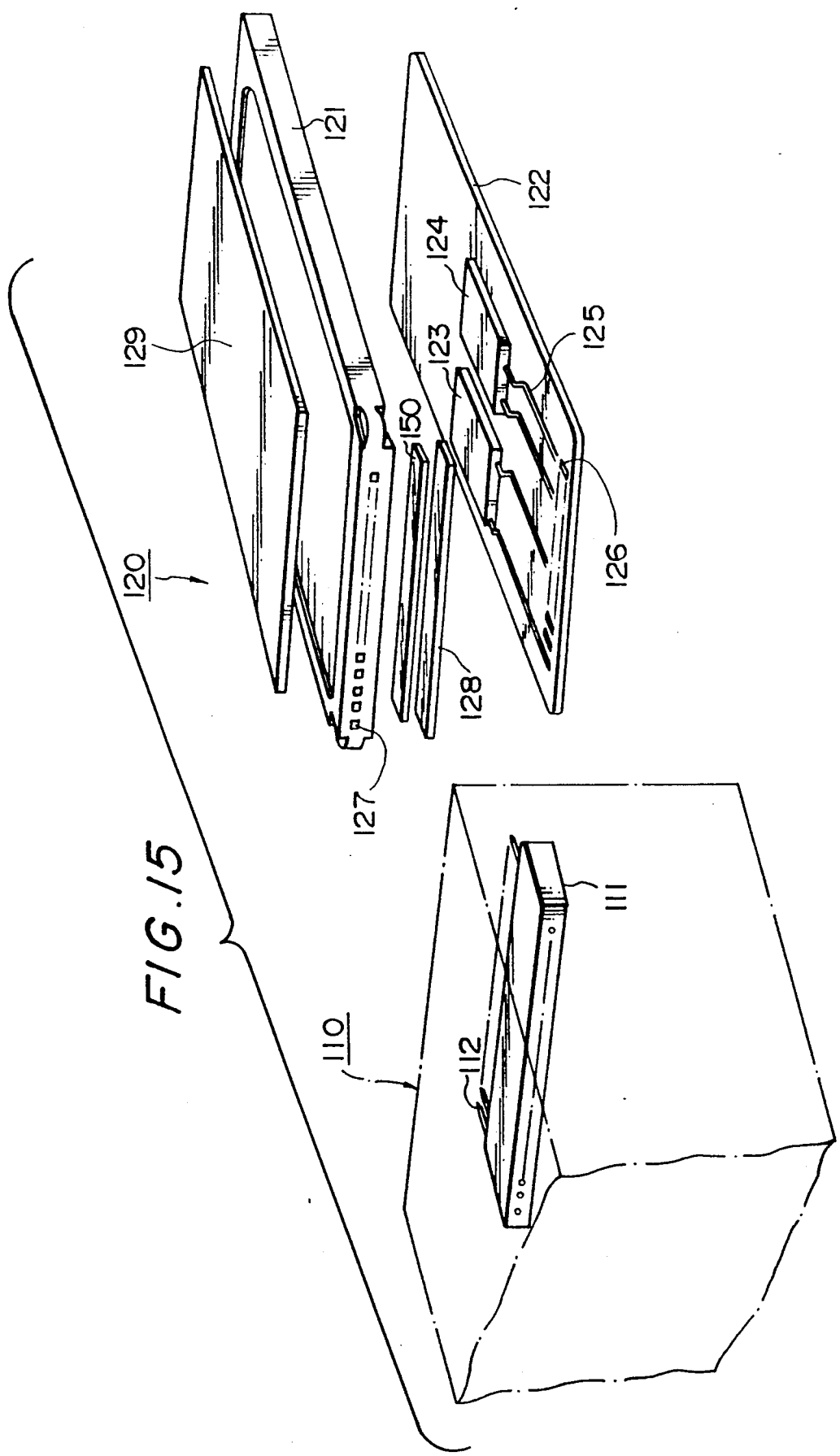
FIG. 15 is an exploded perspective view of an IC memory card according to a third embodiment.

FIG. 15 shows an IC memory card according to a third embodiment; various parts identical with those of the first embodiment are designated by like reference numerals with 100 added thereto, and their detailed description is omitted here for clarity.

For a significant feature of this embodiment, an elastic retainer plate 150 of insulating rubber is placed over an interconnector 128 to seal an interconnector receiving chamber. The end surface of the interconnector 128 is brought into intimate contact, e.g., laminated with the retainer plate 150 while the terminal pins are not yet inserted, thereby reliably preventing dust or the like from penetrating from the external environment.

Figure 16:
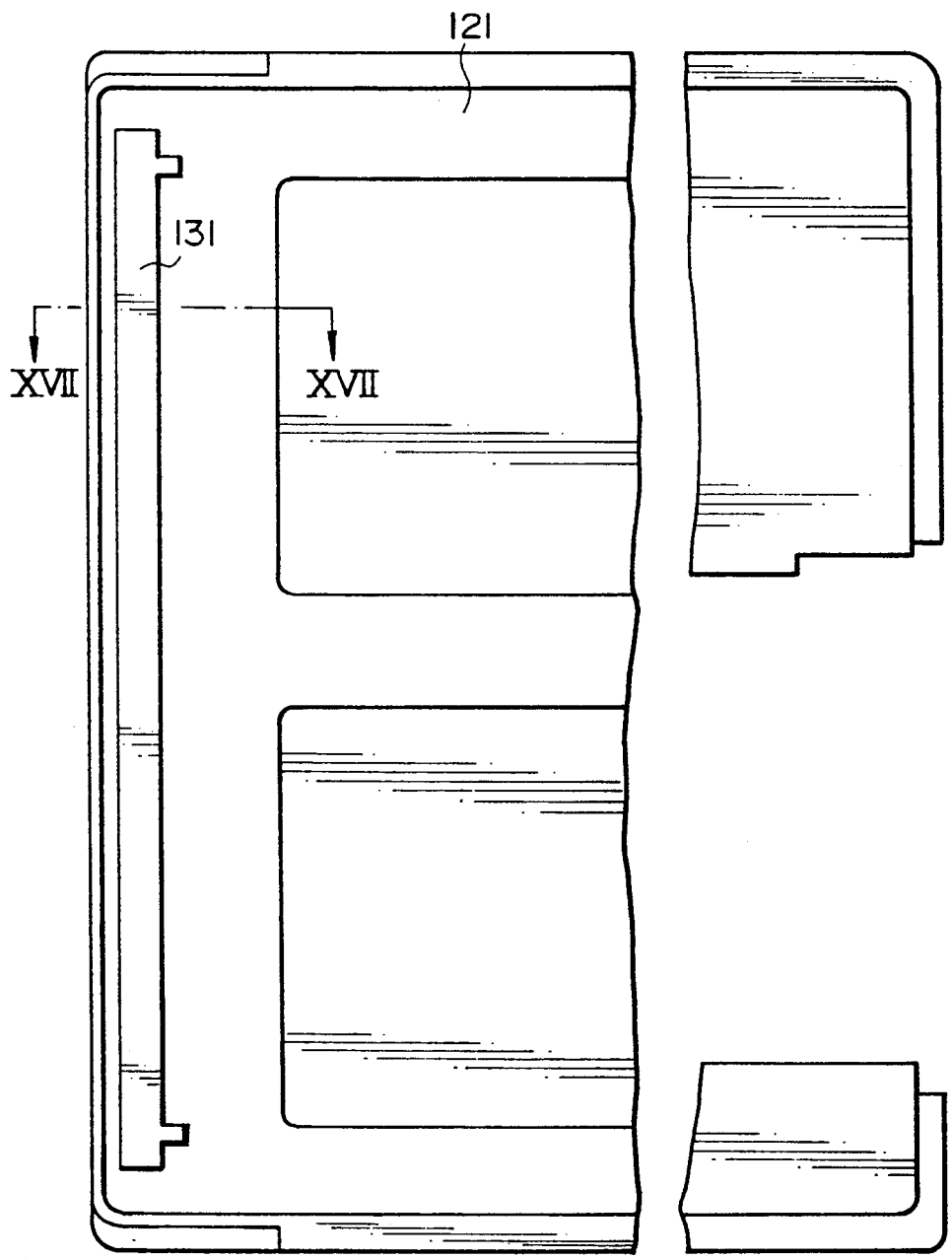
FIG. 16 is a fragmentary bottom view of a card case of the third embodiment.
Figure 17:
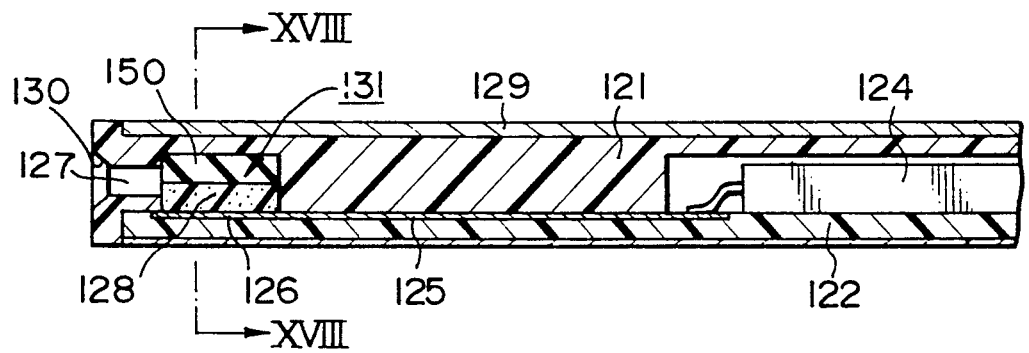
FIG. 17 is a fragmentary cross-sectional view taken along line 17—17 of FIG. 16, showing the manner in which an interconnector and a retainer plate are mounted in which a printed wiring board is fixed.
Figure 18:
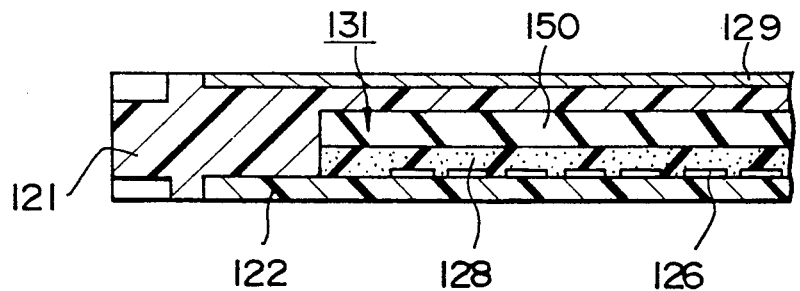
FIG. 18 is a fragmentary cross-sectional view taken along line 18—18 of FIG. 17.

FIG. 16 is a bottom view of a card case 121 of the second embodiment, and FIG. 17 is a cross sectional view taken along line 17—17 of FIG. 16, showing the manner in which the interconnector 128 and the retainer plate 150 are mounted in an interconnector receiving chamber 131 and in which a printed wiring board is incorporated in the card case 121. FIG. 18 is a cross-sectional view taken along line 18—18 of FIG. 17.

FIGS. 16, 17 and 18 are similar to FIGS. 2, 4 and 5, respectively, of the first embodiment. It will be helpful for better understanding if the reader makes reference to FIGS. 2, 4 and 5.

Another feature of the third embodiment is that the interconnector 128 and the retainer plate 150 are placed one over the other in the interconnector receiving chamber 131 to substantially seal the interconnector receiving chamber 131.

As a consequence, the third embodiment does not require the combteeth-like connector holders 33 of FIG. 5.

In this invention, the retainer plate 150 is in the form of an elastic thin strip such as of silicon rubber. According to this embodiment, the retainer plate 150 is in the form of a single strip over which the interconnector 148 is placed.

As is apparent from FIGS. 17 and 18, with the retainer plate 150 and the interconnector 128 both mounted in the interconnector receiving chamber 131, the printed wiring board 122 is incorporated in the card case 121 so that correct positioning can be performed without any special fixing or retaining mechanism, causing a very good assembleability.

Figure 19:
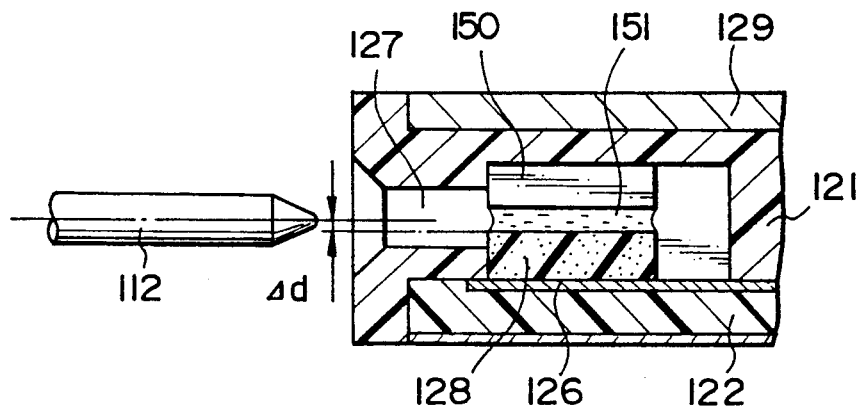
FIG. 19 shows the manner in which the individual terminal pin is inserted according to the third embodiment.

FIG. 19 shows the manner in which the individual terminal pin 112 of the third embodiment is inserted. Providing the offset Δd between the central axis of the terminal pin 112 and the surface of the interconnector 128 is preferable to obtain a good durability.

Also in FIG. 19, it is more preferably that a lubricant such as silicon oil should be applied between the interconnector 128 and the retainer plate 150, thereby keeping the joint portions of the two airtightly.

Therefore, even if the conductive wires provided on the interconnector 128 uses a non-metal oxide, the surfaces of the conductive wires are not exposed to the interior so that frictional resistance can be prevented reliably from increasing due to oxidation.

When the terminal pins 112 are inserted into the openings 127 from the position of FIG. 19, the terminal pins 112 are forced into the interior, with spreading the interconnector 128 and the retainer plate 150 apart from each other. And the distal ends of the terminal pins 112 project from the contact surface between the interconnector 128 and the retainer plate 150, thus obtaining a good feeling of insertion.

Further, when the terminal pins 112 are drawn out, the interconnector 128 and the retainer plate 150 are brought into contact with each other directly or via the lubricant 151 without being exposed to the external environment to prevent oxidation.

In this embodiment, like the second embodiment, it is preferable to the two rows of openings are disposed one over the other so that a multi-pin memory card can be achieved without difficulty.

Figure 20:
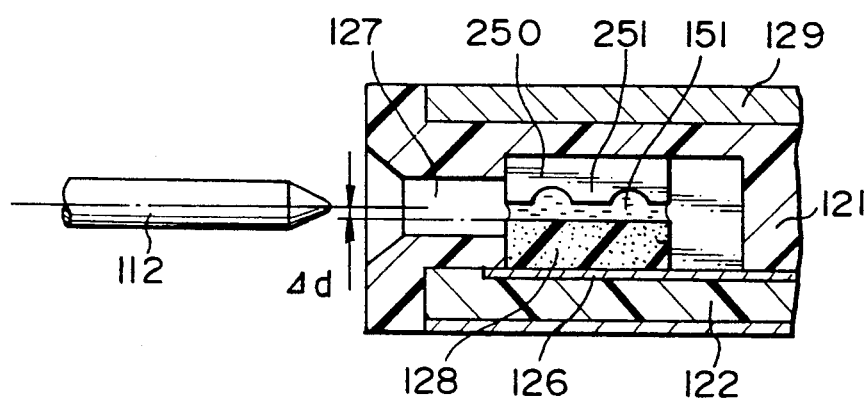
FIG. 20 is a fragmentary cross-sectional view similar to FIG. 19, but showing a fourth embodiment.

FIG. 20 shows a fourth embodiment; like reference numerals designate parts similar to those of the third embodiment.

For a significant feature of the fourth embodiment, a retainer plate has a waveshape surface with three longitudinally extending ridges 251.

As a result, when the terminal pins 112 are inserted, the retainer plate 250 is easily deformed to give a very smooth touch of insertion. Further, since airtightness with the external environment is achieved by the ridges reliably, the surface of the interconnector 128 is not exposed to the external environment which guarantees good durability, same as the third embodiment.

Figure 21:
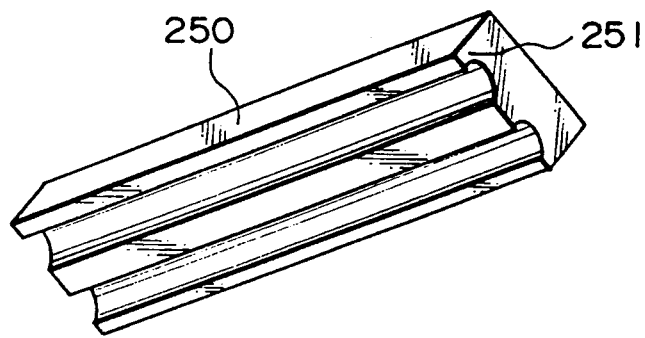
FIG. 21 is a fragmentary perspective view of a retainer plate shown in FIG. 20.

FIG. 21 is a perspective view, as viewed from the bottom, of the retainer plate 250 having the ridges 251.

Figure 22:
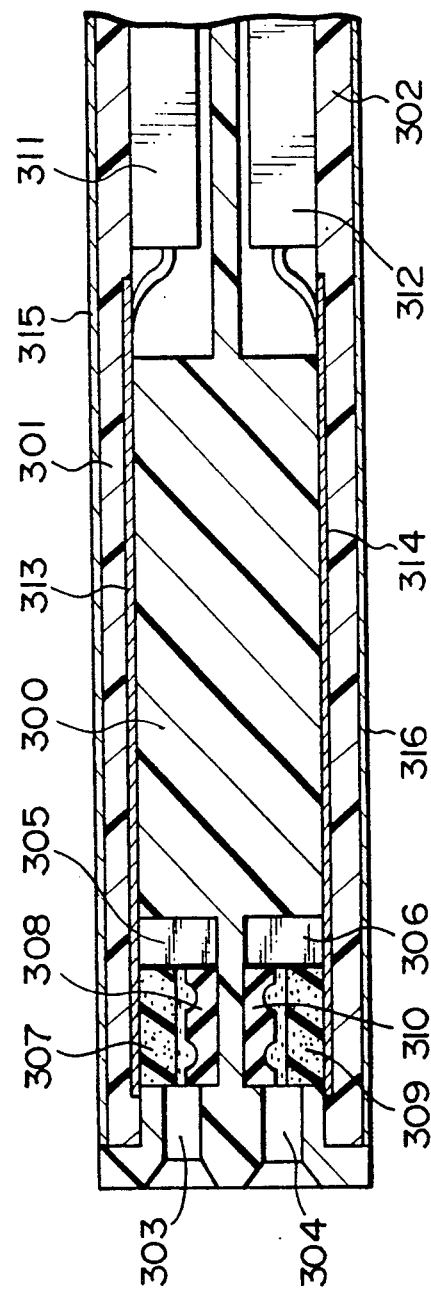
FIG. 22 is a fragmentary cross-sectional view showing a fifth embodiment.

FIG. 22 shows an IC memory card according to a fifth embodiment. The memory card of this embodiment has a pair of rows of connectors, and upper and lower printed wiring boards 301, 302 disposed on opposite surfaces of a card case 300.

The card case 300 has two rows of openings 303, 304. A pair of interconnector receiving chambers 305, 306 is disposed rearwardly of the openings 303, 304 and communicates therewith.

Further, in each of the interconnector receiving chambers 305 (306), the interconnector 307 and the retainer plate 310 (the interconnector 309 and the retainer plate 310) are accommodated.

Therefore, like the fourth embodiment, the terminal pins can be mounted from the external with maximum smoothness, obtaining an excellent durability.

In the embodiment, the two printed wiring boards 301, 302 carry IC memories 311, 312, respectively, and the IC memories 311, 312 are connected with the interconnectors 307, 309 by the lead wires 313, 314, respectively, like the previous embodiment. Further, on the outside surface of each of the two printed wiring boards 301, 302, the respective aluminum shield plate 315, 316 are mounted to electrostatically shield the corresponding IC memory 311, 312.

Therefore, according to the fifth embodiment, the two printed wiring boards 301, 302 are attached respectively to opposite surfaces of the card case 300, and at that time, the retainer plates 308, 310 and the interconnectors 307, 309 are mounted respectively in the interconnector receiving chambers 305, 306. The external terminal pins and the IC memories 311, 312 are connected with one another very easily by a self-alignment action.

Also in this embodiment, since the interconnectors 307, 309 are shielded from the external environment by the retainers 308, 310, dust or the like can be prevented from penetrating, and oxidation due to contact with air can be prevented reliably.

As discussed above, according to this invention, it is possible to achieve a connector structure of an IC memory card which structure is to be simple and hence can be assembled easily.

Further, the alignment of the connector can be achieved by a self-alignment action, without thinking over about alignment with the openings or the terminal pins.

In addition, since the interconnector is airtightly sealed by placing the retainer plate of elastic rubber over the interconnector, it is possible to improve the durability of the connector parts remarkably and to prevent dust reliably from penetrating from the external environment.

Also, since the retainer plate is provided with longitudinally extending ridges, the retainer plate can deform easily thus causing smooth insertion of the terminal pins and improving the durability of the interconnector and the retainer plate.

Still further, since the terminal pins project rearwardly from the interconnector, it is possible to improve the distances of insertion when the terminal pins are inserted.

What is claimed is:

1. An IC memory card comprising:
   (a) an electrically insulating card case having a row of openings for receiving terminal pins of a read/writer and an interconnector receiving chamber communicating with said openings;
   (b) a printed wiring board fixed to said card case and carrying an IC memory, said printed wiring board being provided with a lead terminal which is disposed in said interconnector receiving chamber and is electrically connected with said IC memory at positions corresponding to said openings;
   (c) an interconnector being conductive in a direction of thickness and being made of an anisotropic conductive rubber, said interconnector being mounted in said interconnector receiving chamber and being, at one end of the direction of thickness, electrically coupled with said IC memory and being at the other end adapted to engage the terminal pins when the terminal pins are inserted through said openings, whereby the terminal pins are electrically conducted with said IC memory; and
   (d) a second interconnector in said card case mounted on a second interconnector receiving chamber and a second printed wiring board identical with said printed wiring board in said card case, and wherein said row of openings and said interconnector receiving chamber are disposed one over the other in said card case, wherein the two printed wiring boards are disposed on opposite surfaces of said card case, there being an IC memory carried by each of said printed wiring boards.

2. An IC memory card comprising:
   (a) an electrically insulating card case having a row of openings for receiving terminal pins of a read/writer and an interconnector receiving chamber communicating with said openings;
   (b) a printed wiring board fixed to said card case and carrying an IC memory, said printed wiring board being provided with a lead terminal which is disposed in said interconnector receiving chamber and is electrically connected with said IC memory at positions corresponding to said openings;
   (c) an interconnector being conductive in a direction of thickness and being made of an anisotropic conductive rubber, said interconnector being mounted in said interconnector receiving chamber and being, at one end of the direction of thickness, electrically coupled with said IC memory and being at the other end adapted to engage the terminal pins when the terminal pins are inserted through said openings, whereby the terminal pins are electrically conducted with said IC memory; and
   (d) a retainer plate of elastic insulating rubber disposed in said interconnector receiving chamber in a laminated relationship with said interconnector, said retainer plate having at least one longitudinally extending ridge formed by at least one concave groove in said retainer plate.

3. An IC memory card according to claim 2, wherein entire surfaces of said interconnector and said retaining plate are disposed in intimate contact with each other when the terminal pins are not inserted through said openings.

4. An IC memory card according to claim 3, wherein there is a lubricant applied between said interconnector and said retainer plate.

5. An IC memory card according to claim 2, wherein said interconnector is in the form of an anisotropic conductive rubber strip corresponding to said row of openings.

6. An IC memory card according to claim 2, wherein there is in said card case a second interconnector mounted on a second interconnector receiving chamber and a second printed wiring board identical with said printed wiring board in said card case, and wherein said row of openings and said interconnector receiving chamber are disposed one over the other in said card case.

7. An IC memory card according to claim 6, wherein the two printed wiring boards are disposed on opposite surfaces of said card case, there being an IC memory carried by each of said printed wiring board.

8. An IC memory card according to claim 2, wherein said row of openings and said interconnector receiving chamber are disposed one over the other, said printed wiring board carrying two IC memories, one on each of opposite surfaces of said printed wiring board.

* * * * *